US011018096B2

United States Patent
Sabouret et al.

(10) Patent No.: US 11,018,096 B2
(45) Date of Patent: May 25, 2021

(54) CRACK SENSOR FOR SENSING CRACKS IN A SOLDER PAD, AND METHOD FOR PRODUCTION QUALITY CONTROL

(71) Applicants: STMicroelectronics (Crolles 2) SAS, Crolles (FR); STMicroelectronics (Grenoble 2) SAS, Grenoble (FR)

(72) Inventors: Eric Sabouret, Saint Ismier (FR); Krysten Rochereau, Allevard (FR); Olivier Hinsinger, Barraux (FR); Flore Persin-Crelerot, Eybens (FR)

(73) Assignees: STMicroelectronics (Crolles 2) SAS, Crolles (FR); STMicroelectronics (Grenoble 2) SAS, Grenoble (FR)

( * ) Notice: Subject to any disclaimer, the term of this patent is extended or adjusted under 35 U.S.C. 154(b) by 43 days.

(21) Appl. No.: 16/210,149

(22) Filed: Dec. 5, 2018

(65) Prior Publication Data
US 2019/0172795 A1 Jun. 6, 2019

(30) Foreign Application Priority Data
Dec. 6, 2017 (FR) .................................... 1761685

(51) Int. Cl.
*H01L 21/66* (2006.01)
*H01L 23/00* (2006.01)
*H05K 3/34* (2006.01)
*H01L 23/498* (2006.01)

(52) U.S. Cl.
CPC ............ *H01L 23/562* (2013.01); *H01L 22/34* (2013.01); *H01L 23/49816* (2013.01); *H01L 24/05* (2013.01); *H05K 3/3436* (2013.01); *H01L 2224/05093* (2013.01); *H01L 2924/14* (2013.01)

(58) Field of Classification Search
CPC . H01L 23/562; H01L 24/05; H01L 23/49816; H01L 22/34; H05K 3/3436
USPC ........................................................ 257/758
See application file for complete search history.

(56) References Cited

U.S. PATENT DOCUMENTS

| 2006/0189007 A1 | 8/2006 | Aoki et al. |
| 2008/0142975 A1 | 6/2008 | Ning |
| 2012/0092033 A1* | 4/2012 | Shao ...................... H01L 22/34 324/750.01 |

(Continued)

FOREIGN PATENT DOCUMENTS

JP 2011222861 A 11/2011

OTHER PUBLICATIONS

INPI Search Report and Written Opinion for FR 1761685 dated Jul. 17, 2018 (9 pages).

*Primary Examiner* — Selim U Ahmed
(74) *Attorney, Agent, or Firm* — Crowe & Dunlevy

(57) ABSTRACT

An integrated circuit includes a solder pad which includes, in a superposition of metallization levels, an underlying structure formed by a network of first regular metal tracks that are arranged for reinforcing the mechanical strength of the underlying structure and electrically connecting between an upper metallization level and a lower metallization level of the underlying structure. The underlying structure further includes a detection electrical path formed by second metal tracks passing between the first metal tracks in the metallization levels, the detection electrical path having an input terminal and an output terminal. Electrical sensing of the detection electrical path is made to supply a measurement which is indicative of the presence of cracks in the underlying structure.

25 Claims, 6 Drawing Sheets

(56) References Cited

U.S. PATENT DOCUMENTS

2017/0309530 A1   10/2017   Ilkov

\* cited by examiner

FIG.1
PRIOR ART
FIG.2
PRIOR ART
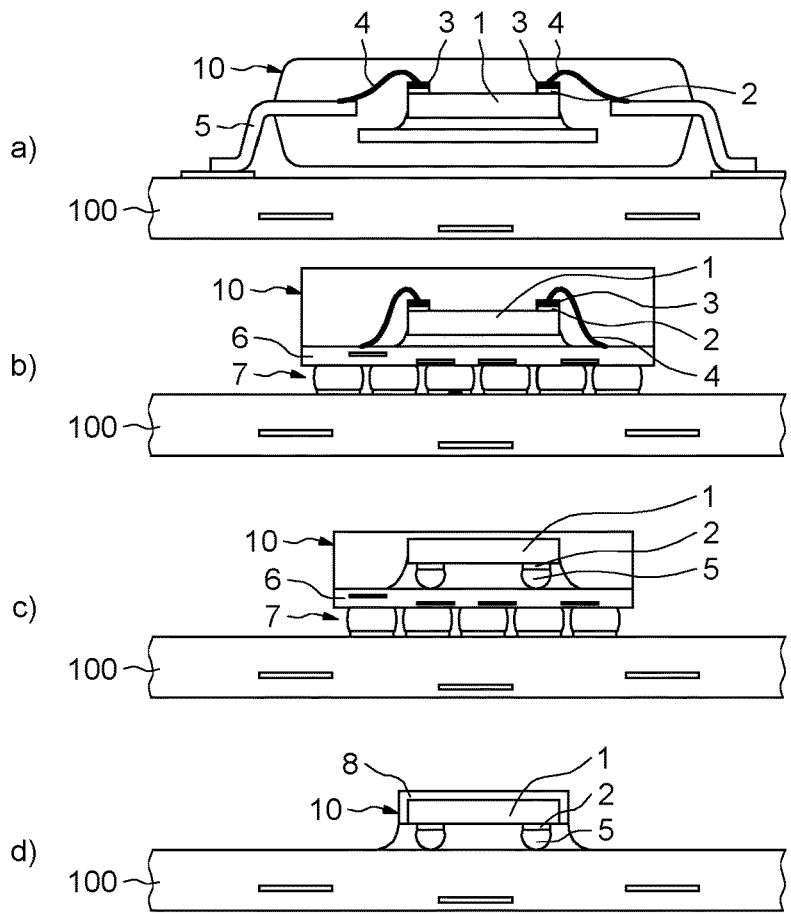
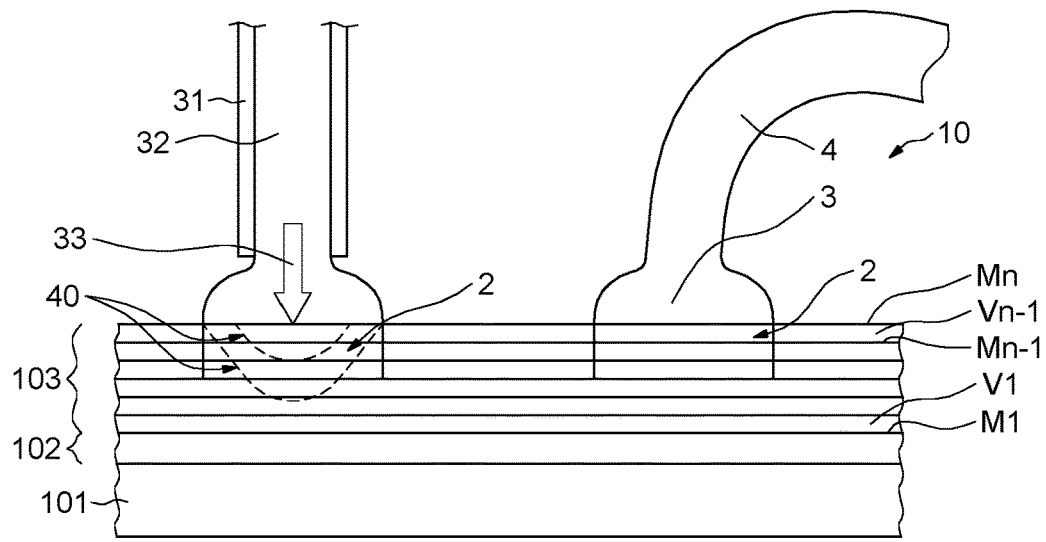

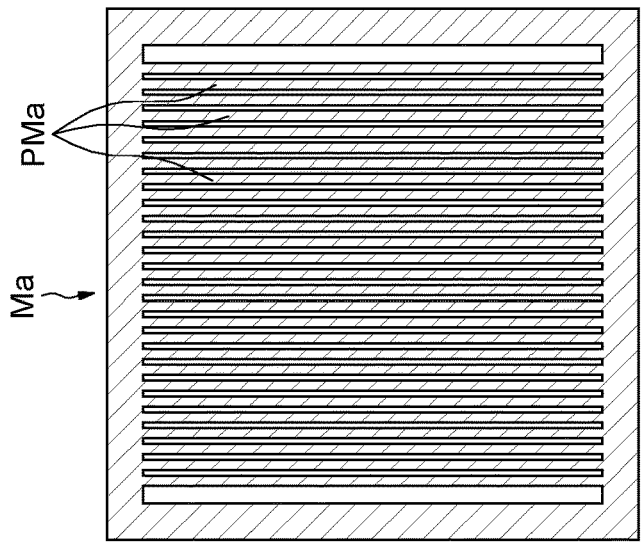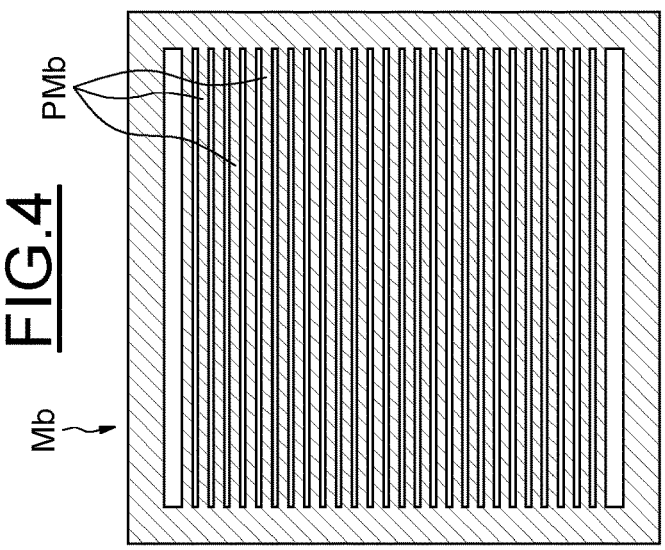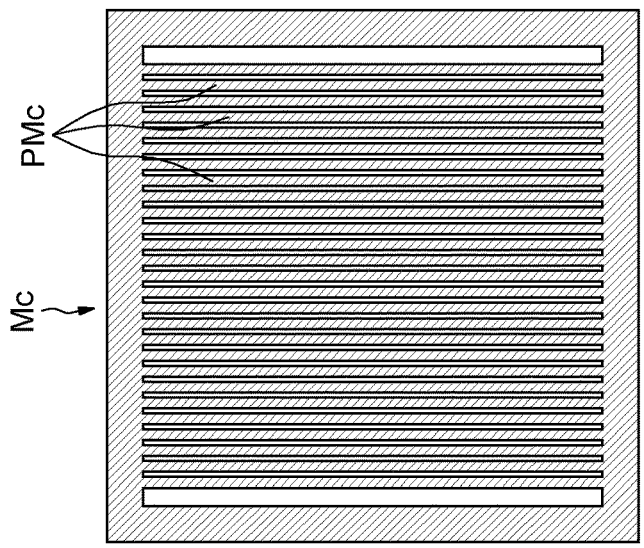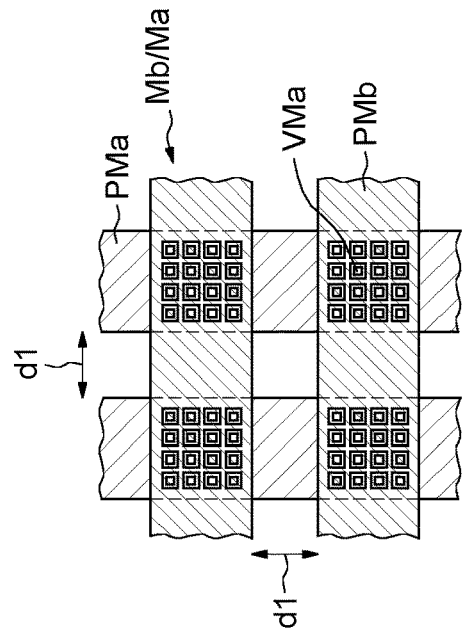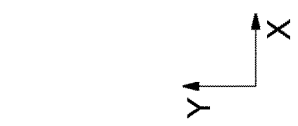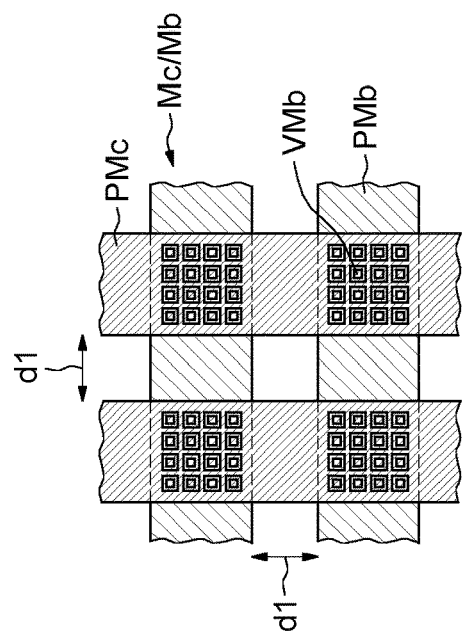
FIG.4

CRACK SENSOR FOR SENSING CRACKS IN A SOLDER PAD, AND METHOD FOR PRODUCTION QUALITY CONTROL

PRIORITY CLAIM

This application claims the priority benefit of French Application for Patent No. 1761685, filed on Dec. 6, 2017, the content of which is hereby incorporated by reference in its entirety to the maximum extent allowable by law.

TECHNICAL FIELD

Embodiments and implementations relate to electronic circuits, notably integrated circuits, and more particularly to circuit reliability and production quality control.

BACKGROUND

FIG. 1 shows four examples, labeled a), b), c), and d), respectively, of integrated circuit packages.

The functional part of an integrated circuit (otherwise referred to as a "chip") is formed in and on a semiconductor substrate 1, and packed in a package 10 generally intended to be connected onto a printed circuit board 100.

In the four examples, the chip 1 comprises solder interfaces, known as bonding pads 2, accommodating, for example, a wire 4 end 3 fastening ("wedge bonding") or a solder ball 5, intended to be connected with the outside of the package.

Example a) of FIG. 1 corresponds to a DIL (acronym of Dual In-Line) package 10 in which the wire 4 ends 3 are connected to external pins 5 intended to be soldered or embedded in a carrier.

Example b) of FIG. 1 corresponds to a BGA (acronym of Ball Grid Array) package 10 in which the wire 4 ends 3 are connected to a distribution network 6 distributing the connections in a network of larger balls 7, intended to be soldered.

Example c) of FIG. 1 also corresponds to a BGA package 10, but in which the solder balls 5 are directly in contact with the distribution network 6, in a technology known as "flip-chip".

Example d) of FIG. 1 corresponds to an EWLB (acronym derived from Embedded Wafer Level Ball grid array) package 10 in a network technology with balls embedded at the level of the substrate, in which the solder balls 5 are connected directly to the printed circuit board, in a flip-chip configuration. The chip 1 is nevertheless protected by a molded frame 8 covering the chip.

FIG. 2 represents a chip 1 intended to be packed in a package at the time of forming a wire 4 end 3. For example, the wire 4 end 3 is soldered by applying a vertical force and ultrasonic vibration.

The electronic components are formed in and on a semiconductor substrate 101 of the chip 1 (i.e. in the part corresponding to the "FEOL" for "Front End Of Line"). A first layer level 102 ("MEOL" for "Middle End Of Line") comprises contacts for electrically connecting the electronic components with an interconnection part 103 ("BEOL" for "Back End Of Line"), through a pre-metal dielectric (PMD) layer.

The interconnection part 103 comprises in the usual way conductive tracks on different metallization levels M1-Mn, spaced apart vertically by inter-metal dielectric (IMD) layers, and connected from one level to the other by vertical conductive vias V1-Vn−1.

The interconnection part 103 notably makes it possible to connect the electronic components formed in and on the substrate 101 with each other and with solder pads 2.

Basically, the solder pads 2 comprise a metal plate at the surface intended to be soldered to a solder ball 5 or to a wire 4 end 3, and comprise, for example, a network structure formed in the last metallization levels of the interconnection part 103.

The manufacture of wire 4 ends 3 soldered onto a solder pad 2 comprises, in the example of a technique known as "wedge bonding", an application of a vertical force 33 and ultrasounds reflecting on the solder pad 2 and the underlying levels of the interconnection part 103.

The manufacture of the solder balls 5 comprises, for example, forming a ball metal pre-structure, then melting the metal structure forming a ball.

In a flip-chip mounting of the integrated circuit with a distribution network 6 or directly with a printed circuit board 100 (as according to the examples c) and d) in FIG. 1), a vertical force similar to the force 33 is also transmitted onto the solder pad 2 and the underlying levels of the interconnection part 103.

These forces 33 may be sufficient to break the dielectric and metal layers included in the solder pad 2, introducing cracks 40 in the levels of the interconnection part 103.

The cracks 40, generated in the course of the manufacture of the integrated circuit, may further spread and expand after the manufacture of the integrated circuit.

Such cracks 40 in the metal tracks or in the metal vias may break the electrical conduction and make an integrated circuit dysfunctional, or even unusable.

The appearance of this type of crack is unpredictable. Furthermore, detecting this type of crack usually requires destructive techniques, such as development by chemical means in order to observe the structure.

Yet it is essential in industrial production that integrated circuit products are functional and durable.

SUMMARY

In this regard, provision is made according to one aspect for an integrated circuit comprising at least one solder pad including, in a superposition of metallization levels, an underlying structure comprising a network of first regular metal tracks and arranged for reinforcing the mechanical strength of said underlying structure, and for establishing an electrical connection between the upper level and a lower level of said metallization levels of the underlying structure, said structure further comprising a detection path including, in said metallization levels, second metal tracks passing between the first metal tracks, the detection path having an input terminal and an output terminal intended to supply a measurement representative of the presence of cracks in said structure.

Thus, a measurement between the input terminal and the output terminal of the detection path, e.g. a resistivity measurement, makes it possible to detect cracks generated during the manufacture of the integrated circuit.

For example, with the first metal tracks being spaced apart from each other by an interval of a first width, the second metal tracks have a second width of less than one tenth of the first width.

Thus, fine cracks not initially impacting on the electric conduction of the metal tracks, but which may spread, grow, and eventually, degrade said structure, may be detected directly due to the narrowness of the detection path, which is accordingly more sensitive to the cracks.

According to one embodiment, the first metal tracks of a metallization level are parallel to each other and perpendicular to the first metal tracks of an adjacent metallization level, and the first metal tracks belonging to adjacent metallization levels are electrically connected, at the level of each superposition of said tracks, by at least one first via belonging to a level of vias separating said adjacent metallization levels.

According to one embodiment, the second metal tracks belonging to adjacent metallization levels are electrically connected to each other by at least one second via, belonging to a level of vias separating said adjacent metallization levels.

According to one embodiment, the detection path draws a filling curve passing through a number greater than a floor number of areas in equipartition in said structure, and having a length between the input terminal and the output terminal less than a ceiling value.

The phrase "areas in equipartition in said structure" is defined here and subsequently to mean that these areas are each a balanced division unit of the structure, or, in other words, that these areas all have the same size and together fill the entire surface or volume of the structure.

In general, the detection path is advantageously configured so that the filling curve that it draws provides a compromise between a floor number of maximum value, and a ceiling value of the length of minimum value.

For example, the detection path draws a filling curve along a sinuous course comprising branches arranged in a star about a central region.

According to one embodiment, the integrated circuit includes detection means configured for measuring a resistive value between the input terminal and the output terminal of said detection path.

According to another aspect, provision is made for a method for controlling production of such integrated circuits, including, after a step of soldering a soldered element onto said at least one solder pad of each integrated circuit, a test phase including a measurement of a resistive value between the input terminal and the output terminal of said detection path, and a decision phase in the course of which a quality signal is emitted representative of the quality of said integrated circuit according to the result of the measurement.

Said soldered element may, for example, be a wire end soldered by applying a vertical force and ultrasounds, or even a solder ball intended to undergo a vertical force during mounting.

According to one implementation, the decision phase includes a comparison of the measured resistive value with a reference value, a defective quality signal being emitted if the measured resistive value is greater than the reference value.

A "defective" quality signal is, for example, a signal communicative of a defective integrated circuit comprising cracks in its metallization level structure.

According to one implementation, the method further includes a sorting phase including discarding or not discarding integrated circuits, according to the corresponding quality signal.

According to one implementation, the measurement of a resistive value includes emitting an analogue or digital signal at the input terminal and receiving said analogue or digital signal at the output terminal.

In other words, according to some embodiments an integrated circuit has been defined comprising a crack detection device in a metallization level structure of the solder pad type, combining with said structure a sinuous detection path of minimum size, interleaved in said structure. A fracture in said detection path makes it possible to detect a crack in the structure, with an optimal sensitivity and according to a method suitable for being implemented on all the integrated circuits leaving a production line. Moreover, the detection device may be combined in the metallization level structure without making any major change in the design of said structure, which may, for example, be first characterized with regard to resistance to a mechanical stress.

BRIEF DESCRIPTION OF THE DRAWINGS

Other advantages and features of the invention will appear on examining the detailed description of embodiments and implementations, in no way restrictive, and the attached drawings in which:

FIGS. 1 and 2, previously described, respectively illustrate integrated circuit packages and a chip intended to be packed in such a package;

FIG. 4 is a top view, i.e. in the plane of the integrated circuit, shown metal tracks of a metallization levels;

DETAILED DESCRIPTION

Figure 3:
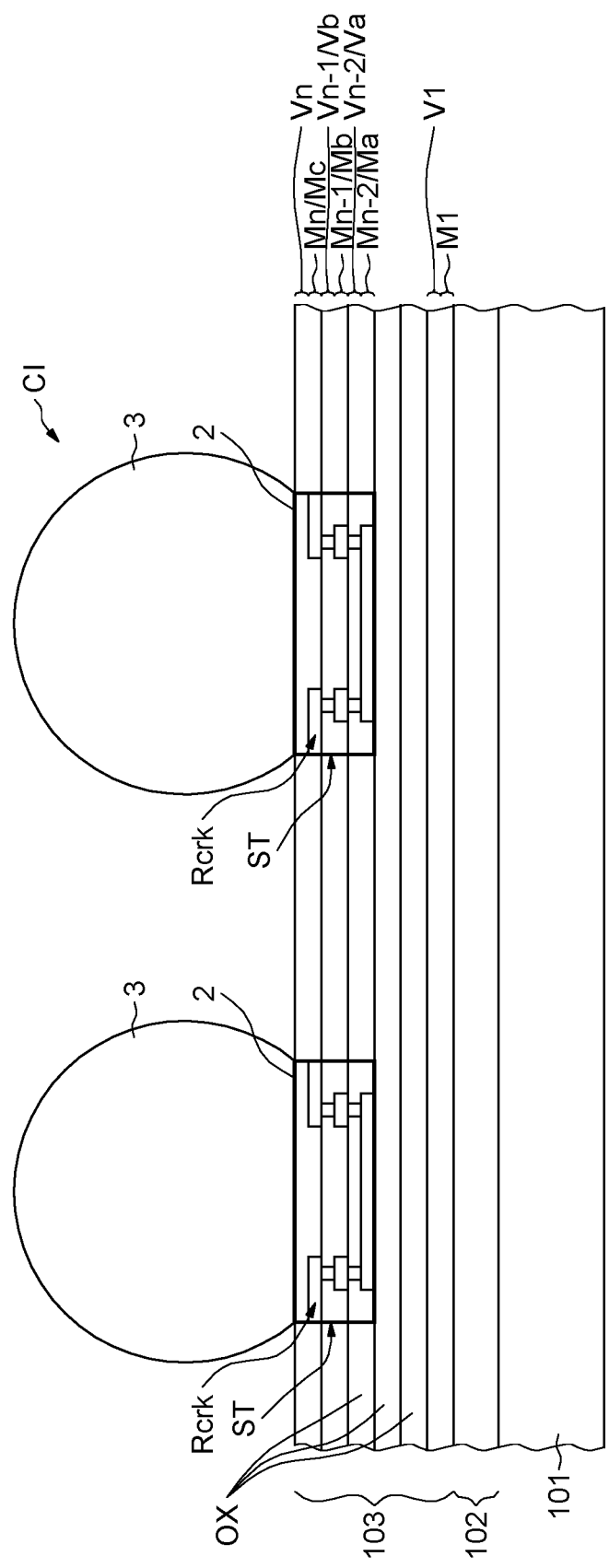
FIG. 3 shows an integrated circuit comprising a crack detection device suitable for a solder pad.

FIG. 3 represents an example of an application of an integrated circuit comprising a crack detection device suitable for a solder pad 2 of an integrated circuit CI.

The integrated circuit CI comprises a semiconductor substrate 101, on and in which the active components of the integrated circuit CI are formed, such as transistors or diodes.

A first layer level 102 ("MEOL", for "Middle End Of Line") comprising a pre-metal dielectric layer covering the active components at the surface of the substrate, and conductive contacts for electrically connecting said active components with an interconnection part 103 ("BEOL" for "Back End Of Line").

The interconnection part 103 includes metallization levels M1-Mn, spaced apart vertically by levels of vias V1, Vn−1 including inter-metal dielectric layers OX, and electrically conductive vias. The metallization levels M1-Mn comprise metal tracks connected from one level to another by the vias, forming a network interconnecting the active components with each other and with the outside of the integrated circuit.

The interconnection part 103 comprises solder pads 2 respectively intended to accommodate a soldered element 3.

The soldered elements 3 make it possible, for example, to electrically connect the integrated circuit CI to a distribution network of a package, or directly to a printed circuit board, or even to mechanically attach the integrated circuit to a package.

Although solder balls 3 are represented in FIG. 3, the soldered elements may also be a wire end soldered by applying a vertical force and ultrasounds, or any other element for connecting the integrated circuit to the outside.

At least one solder pad 2 incorporates an underlying structure ST comprising metal tracks of a first width (not represented in FIG. 3) in at least one metallization level of said interconnection part 103.

In this example, the structure ST extends into the last three metallization levels Mn−2, Mn−1, Mn and into the last two levels of vias Vn−2, Vn−1.

Of course, such a structure may extend into as many metallization levels and levels of vias as necessary, the example of the number three being chosen arbitrarily for brevity's sake.

For reasons of convenience of reading, the metallization levels in which the structure ST is formed are designated respectively here and subsequently by the references Ma, Mb, Mc and the corresponding levels of vias by the references Va, Vb.

The structure ST further comprises an electrically conductive detection path Rcrk of a second width less than the first width. The detection path Rcrk has an input terminal and an output terminal intended to supply a measurement representative of the presence of a crack in said structure, e.g. such a measurement may be a measurement of the resistive value of the detection path Rcrk.

The detection path is configured for forming, in the metallization levels, a sinuous course passing between at least some of said metal tracks.

Thus, a measurement of the resistive value of the detection path Rcrk may be implemented by a measurement circuit MES connected to the detection path Rcrk, e.g. formed in the substrate 101 of the integrated circuit.

The measurement circuit MES comprise, for example, an input-output register configured for applying an analog or digital signal to the input terminal I and picking up this analog or digital signal from the output terminal O.

The length of the detection path Rcrk is configured so that the nominal resistive value of a non-cracked path is not excessive to the point of not being able to measure a variation in said resistive value due to a crack in the detection path.

If a crack damages the detection path Rcrk, it is safe to assume that the signal received by the output register is not the same as the signal emitted by the input register. The measurement circuit is thus configured for quantifying a resistive value of the detection path Rcrk according to potential differences between the signal received at the output O and the signal emitted at the input I.

FIG. 4 represents, in a top view, i.e. in the plane of the integrated circuit, metal tracks of a first metallization level Ma, a second metallization level Mb, and a third metallization level Mc, intended to be superimposed in order to form a solder pad (2) structure (ST).

It should be recalled that the first metallization level Ma, the second metallization level Mb, and the third metallization level Mc correspond respectively to the last three metallization levels Mn−2, Mn−1, Mn of the interconnection part 103, in the example in FIG. 3.

First parallel metal tracks PMa located on the first metallization level Ma, spaced apart from each other by an interval having a first width d1, extend in a first direction Y.

Second first parallel metal tracks PMb located on the second metallization level Mb, spaced apart from each other by an interval having a first width d1, extend in a second direction X perpendicular to the first direction Y.

Third first parallel metal tracks PMc located on a third metallization level Mc, spaced apart from each other having a first width d1, extend in the first direction Y.

In what follows, the "first first track PMa", "second first track PMb" and "third first track PMc" may be designated globally by the term "first tracks PMa, PMb, PMc" or nominally by the respective terms "first track PMa", "second track PMb" and "third track PMc". The interpretation of the text will make it possible to unambiguously distinguish the "second first tracks PMb" from the "second tracks Ra, Rb, Rc" belonging to the detection path Rcrk introduced later.

The first metallization level Ma, the second metallization level Mb and the third metallization level Mc are, for example, located at the height of the last three metallization levels of the interconnection part (103) of an integrated circuit.

The intervals spacing out said metal tracks PMa, PMb, PMc are usually filled with a dielectric material of an inter-metal layer belonging to respective levels of vias Va, Vb, in a usual way in the interconnection parts.

The width of the intervals between said metal tracks is, for example, between 1 µm and 1.5 µm.

In order to form the solder pad, the first metallization level Ma, the second metallization level Mb and the third metallization level Mc are stacked and electrically connected.

The first metal tracks PMa, PMb, PMc of each metallization level Ma, Mb, Mc are electrically connected by vertical vias VMa, VMb traversing an inter-metal dielectric layer spacing them apart vertically and belonging to the respective levels of vias Va, Vb. Thus, at the interface Mb/Ma between the first and the second metallization level, first vertical and electrically conductive vias VMa connect each first metal track PMa to each second metal track PMb, through the respective inter-metal dielectric layer.

Each superposition between the first metal tracks PMa extending in the first direction Y and the second metal tracks PMb extending in the second direction X comprises, for example, sixteen vias VMa connecting each of them together.

Superposition is understood to mean the intersections of said tracks seen in plan, i.e. each location where tracks intersect one above the other.

Similarly, at the interface Mc/Mb between the second and the third metallization level, second vertical and electrically conductive vias VMb connect each second metal track PMb to each third metal track PMc, through the corresponding inter-metal dielectric layer.

Each superposition between the second metal tracks PMb extending in the second direction X and the third metal tracks PMc extending in the first direction Y comprises, for example, sixteen vias VMb connecting each of them together.

Figure 5:
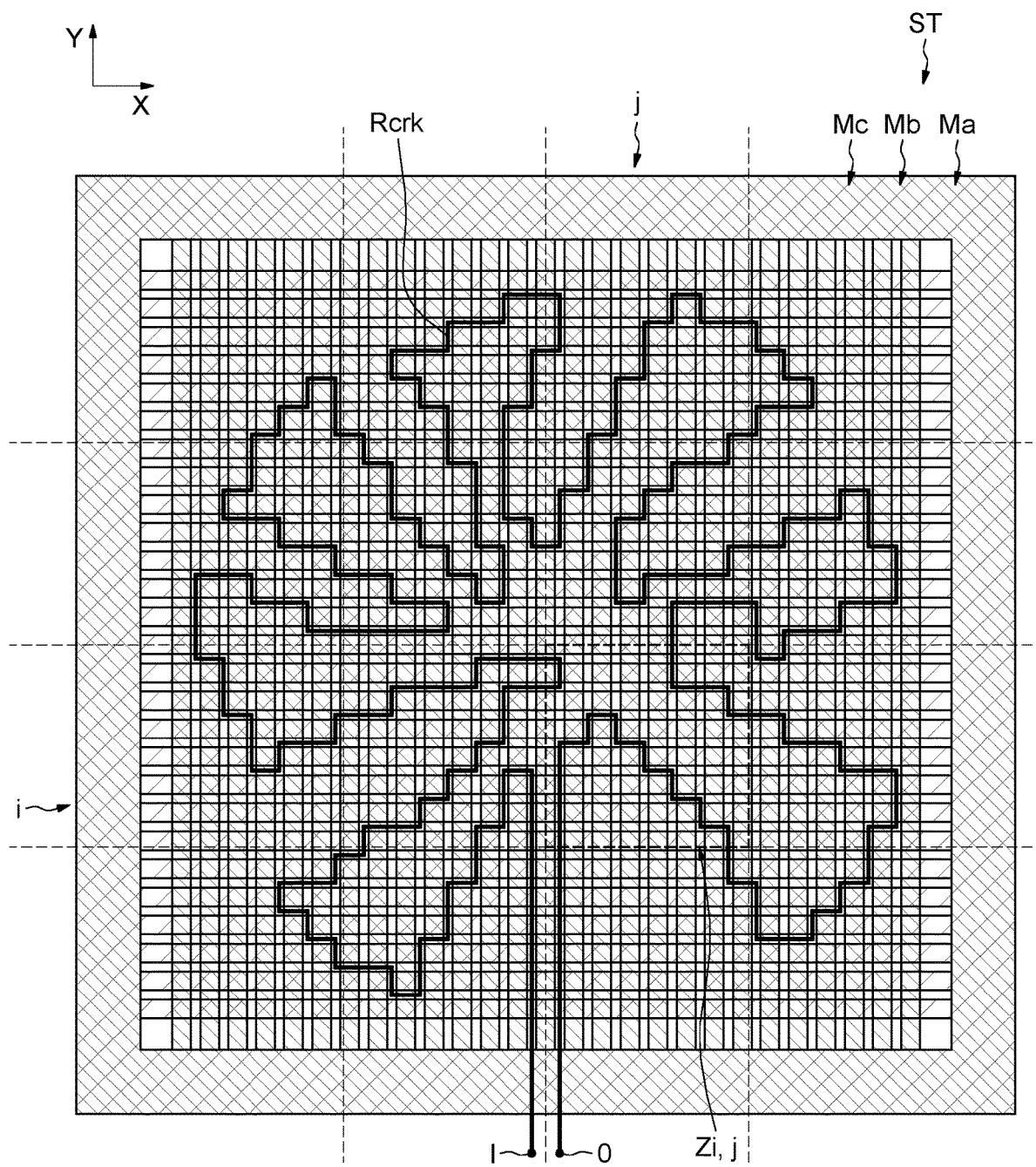
FIG. 5 represents a structure including the stacking of metallization levels.

FIG. 5 represents a structure ST including the stacking of the third metallization level Mc, on the second metallization level Mb, itself on the first metallization level Ma. The structure further comprises a detection path Rcrk including, in the metallization levels Ma, Mb, Mc, second metal tracks Ra, Rb, Rc, passing respectively between the first metal tracks PMa, PMb, PMc, and having a second width (d2) less than the first width (d1), the detection path Rcrk comprising an input terminal I and an output terminal O.

The second width (d2) of the detection path is advantageously equal to the thinnest width allowed by the design rules.

For example, the second width (d2) of the detection path Rcrk is between 0.1 µm and 0.15 µm, or, more generally, the second width (d2) of the detection path Rcrk is equal to or less than substantially a tenth of the first width (d1).

The second width (d2) is configured for not having to modify or adapt an existing structure ST, for example, previously characterized with regard to resistance to mechanical stresses.

The input terminal I and the output terminal O may be located outside the structure ST of superposed metallization levels.

In general, the detection path Rcrk draws a filling curve which covers a maximum of areas of the structure ST.

In this example, the detection path Rcrk takes a sinuous course roughly having a flower shape, i.e. having substantially triangular branches linked in a star around a central point.

Of course other shapes of the detection path Rcrk are conceivable, such as, for example, a herringbone pattern course comprising an alternation of long lines extending in the first direction Y and short lines extending in the second direction X, from one end to the other of the metallization level structure (Ma, Mb, Mc), in the direction of the second direction X; or a course in the shape of a simple or double spiral, or even a "Peano curve" fractal course.

Generally also, the filling curve drawn by the detection path Rcrk is configured for passing through a maximum of areas $Z_{i,j}$ in equipartition in said structure, while minimizing its length between the input terminal I and the output terminal O.

The phrase "areas in equipartition in said structure" is defined here and subsequently to mean that these areas are each a balanced division unit of said structure, or, in other words, that these areas all have the same size and together fill the entire surface or volume of said structure.

For example, an area $Z_{i,j}$ corresponds to an imaginary subdivision of the metallization level layer divided into i rows of equal sizes and j columns of equal sizes.

In FIG. 5, sixteen areas are represented in dotted lines, resulting from a subdivision into four rows and four columns.

Of course, the number of areas covered may be very variable notably according to the desired result and the degrees of freedom offered by a given technology.

The example represented of a flower-shaped detection path Rcrk passes through each of said sixteen areas $Z_{i,j}$ while minimizing its length.

For example, for a square solder pad measuring 70 μm×70 μm, the length of the detection path Rcrk is less than 1 mm from the input terminal I to the output terminal O, offering a nominal resistive value of between 1000 and 1500 ohms.

Figure 6A:
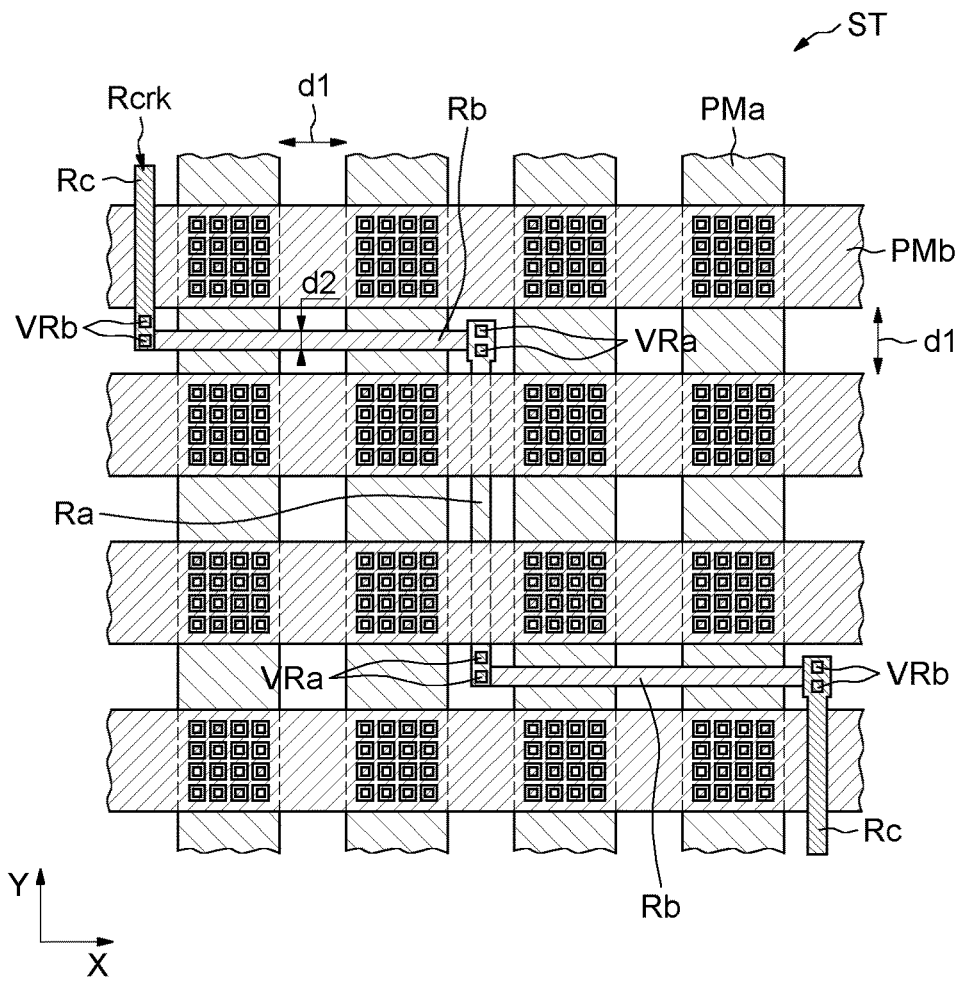
FIGS. 6A and 6B represent a detail of a detection path.
Figure 6B:
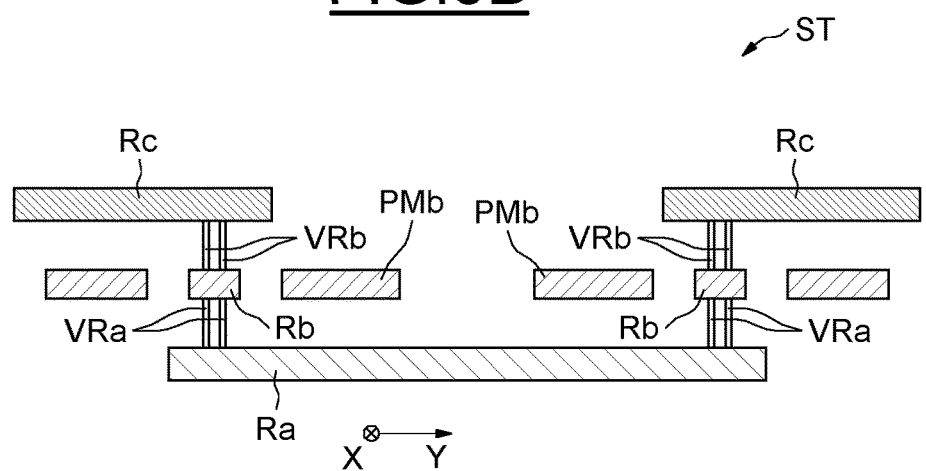

FIGS. 6A and 6B represent a detail of a detection path Rcrk included in a structure ST located in an integrated circuit interconnection part.

The detection path Rcrk comprises first parts Ra extending in the first direction Y into the first metallization level Ma, in intervals between the first metal tracks PMa.

The detection path Rcrk comprises second parts Rb extending in the second direction X into the second metallization level Mb, in intervals between the second metal tracks PMb. The detection path Rcrk comprises third parts Rc extending in the first direction Y into the third metallization level Mc, in intervals between the third metal tracks PMc.

The parts of the detection path Ra, Rb, Rc comprise second metal tracks having a second width d2 less than the first width d1 of the intervals between the first metal tracks PMa, PMb, PMc of the three metallization levels Ma, Mb, Mc.

The first parts Ra of the detection path are connected to the second parts Rb of the detection path by first vertical electrically conductive vias VRa.

The second parts Rb of the detection path are connected to the third parts Rc of the detection path by second vertical electrically conductive vias VRb.

A first part Ra and a third part Rc are connected via a second part Rb of the detection path Rcrk. The second part Rb may not advance in the second direction X and thus make it possible to vertically connect a first part Ra and a third part Rc of the detection path.

The first parts Ra and second parts Rb of the detection path are connected to each other by at least two first vertical vias VRa, and the second parts Rb and third parts Rc of the detection path are connected to each other by at least two second vertical vias VRb.

This makes it possible to reduce the probability of detecting a manufacturing defect in an isolated via as a crack in the metallization level structure.

In summary, in a structure including at least one metallization level comprising metal tracks spaced apart by a first width, the electrically conductive detection path having a second width less than the first width, is located in intervals between at least some of said first metal tracks, and comprises an input terminal and an output terminal.

For example, this structure is a structure underlying a solder pad intended to accommodate a solder ball or a wire end.

Thus, if a crack occurs in said at least one metallization level, it is very probable that the detection path is broken, in view of the thinness of the second width. Hence, the resistive value between the input terminal I and the output terminal O would be increased.

Accordingly, a measurement of the resistive value between the input terminal I and the output terminal O of the detection path Rcrk makes it possible to detect a break in a simple, effective, systematic and non-destructive way.

Figure 7:
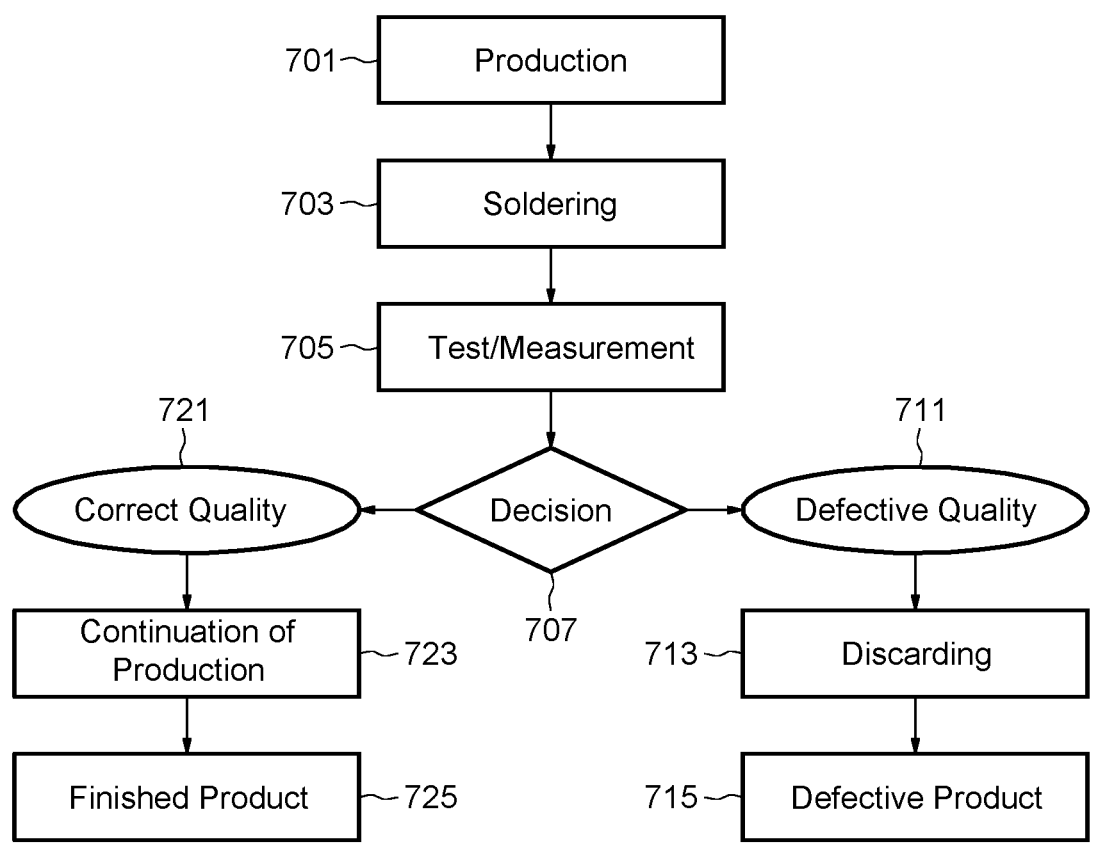
FIG. 7 shows steps of a method for production quality control of integrated circuits.

FIG. 7 represents steps of a method for production quality control of integrated circuits, e.g. in an integrated circuit industrial production line.

The method applies in particular to the detection of cracks generated by a step of soldering an element soldered onto said at least one solder pad (2) such as wire (3) end soldering, or solder ball (5) soldering, previously formed on the solder pads (2), with an external device such as a distribution network or a printed circuit board, as previously described notably in relation to FIGS. 1 and 2.

Thus, the steps involved in this method take place in the course of production 701 of an integrated circuit chip, notably after the manufacture of the active elements in the semiconductor substrate (101) and in the first layer level (102), the manufacture of the interconnection part (103), and the manufacture of the solder pads (2) as previously described.

After a step of soldering 703 a soldered element of said integrated circuit, the method includes a test phase 705.

In the course of the test phase 705, a measurement is performed between the input terminal (I) and the output terminal (0) of the detection path (Rcrk).

For example, this measurement includes a measurement of a resistive value of said detection path (Rcrk).

The measurement of the resistive value of the detection path (Rcrk) may be implemented by measurement circuit that is internal or external to the integrated circuit.

The measurement circuit may belong to the production line, and be used on all the integrated circuits produced on the line, or be integrated into the integrated circuit, in a way dedicated or not dedicated to this measurement.

The measurement circuit comprises, for example, an input-output register configured for applying an analog or digital signal to the input terminal (I) and for receiving this analog or digital signal from the output terminal (0).

The length of the detection path of (Rcrk) is configured so that the resistive value of the non-cracked path is not excessive to the point of not being able to measure a variation in said resistive value due to a crack in the detection path.

If a crack damages the detection path (Rcrk), it is safe to assume that the signal received by the output register is not the same as the signal emitted by the input register.

The test phase 705 is followed by a decision phase 707 in the course of which a quality signal 711, 721 is emitted, representative of the quality of the integrated circuit, according to the result of the measurement of the test phase 705.

Thus, the decision phase 707 includes, for example, a comparison of the measured resistive value with a reference value, and a "defective" quality signal is generated 711 if the measured resistive value is greater than the reference value.

For example, the reference value corresponds to the average resistive value measured on a group of intact detection paths (Rcrk) (i.e. not having any crack originating, for example, from a step of soldering an element onto the solder pad).

This reference value may be biased by a safety margin, e.g. equal to twice the standard deviation of the measurements performed for calculating said average value.

After the decision phase 707 and generating of the quality signal 711, 721, a sorting phase 713, 723 dependent on said quality signal 711, 721 is implemented.

The sorting phase thus includes a discarding 713 of the integrated circuits for which the test phase resulted in an emission 711 of a "defective" quality signal, communicative of a defective integrated circuit, comprising cracks in the structure of the metallization levels.

The products thus discarded are then considered defective 715, and are removed from the production line of integrated circuits intended for sale.

Conversely, the sorting phase includes a continuation of the production 723 of the integrated circuits for which the test phase has resulted in an emission 721 of a correct quality signal, until the finished product is obtained 725, ready to be marketed.

In other words, a crack detection device has been described in a metallization level structure of the solder pad type, combining with said structure a sinuous detection path of minimum size, interleaved in said structure. A fracture in said detection path makes it possible to detect a crack in the structure, with an optimal sensitivity and according to a method suitable for being implemented on all the integrated circuits leaving a production line. Moreover, the detection device may be combined in the metallization level structure without making any major change in the design of said structure.

Furthermore, the invention is not limited to the previously detailed embodiments but embraces all the variants thereof. For example, the invention is suited to different numbers of metallization levels, having different configurations, or even to measured quantities representative of a crack as well as measuring methods different from those described above.

The invention claimed is:

1. An integrated circuit, comprising:
a solder pad;
a superposition of a plurality of metallization levels comprising a network of first parallel metal tracks present under said solder pad in at least two metallization levels and which are electrically connected to the solder pad and arranged for reinforcing a mechanical strength of said solder pad and for establishing an electrical connection between an upper metallization level and a lower metallization level; and
a detection electrical path comprising second metal tracks present under said solder pad in said at least two metallization levels, wherein the second metal tracks are insulated from the first parallel metal tracks, each second metal track passing between two first parallel metal tracks; and
wherein the detection electrical path includes an input terminal and an output terminal configured to permit a measurement of a quality which is indicative of a presence of a crack in said integrated circuit.

2. The integrated circuit according to claim 1, wherein the first parallel metal tracks are spaced apart from each other by an interval of a first width, and wherein the second metal tracks have a second width less than one tenth of the first width.

3. The integrated circuit according to claim 1, wherein the first parallel metal tracks in one of said at least two metallization levels extend parallel to each other in a first direction and wherein the first parallel metal tracks in another of said at least two metallization levels extend parallel to each other in a second direction perpendicular to the first direction, and wherein the first parallel metal tracks of said at least two metallization levels are electrically connected by at least one via belonging to a level of vias separating said at least two metallization levels.

4. The integrated circuit according to claim 1, wherein the second metal tracks in one metallization level of the at least two metallization levels and the second metal tracks in another metallization level of the at least two metallization levels are electrically connected by at least one via belonging to a level of vias separating said at least two metallization levels.

5. The integrated circuit according to claim 1, wherein the detection electrical path has a shape in the form of a filling curve that passes through a number of areas in equipartition in said integrated circuit, said number being greater than a floor number, and said detection electrical path having a length between the input terminal and the output terminal that is less than a ceiling value.

6. The integrated circuit according to claim 1, wherein the detection electrical path has a shape in the form of a filling curve along a sinuous course comprising branches arranged in a star about a central region.

7. The integrated circuit according to claim 1, further comprising a measurement circuit configured to measure a resistive value between the input terminal and the output terminal of said detection electrical path.

8. The integrated circuit according to claim 1, wherein the detection electrical path is sinuous in shape and interlaced with the network of first parallel metal tracks in said integrated circuit.

9. The integrated circuit according to claim 1, wherein the quality which is indicative of the presence of a crack in said integrated circuit is a resistance value of the detection electrical path.

10. An integrated circuit, comprising:
a solder pad; and
an underlying structure formed in a superposition of a plurality of metallization levels below the solder pad and electrically connected to the solder pad, said underlying structure comprising:
in a first metallization level of said plurality of metallization levels:

a first metal track and a second metal track which extend parallel to each other in a first direction; and a third metal track which extends parallel to and between the first and second metal tracks;

wherein a width of the third metal track is less than widths of the first and second metal tracks;

in a second metallization level of said plurality of metallization levels:

a fourth metal track and a fifth metal track which extend parallel to each other in a second direction perpendicular to the first direction; and a sixth metal track which extends parallel to and between the fourth and fifth metal tracks;

wherein a width of the sixth metal track is less than widths of the fourth and fifth metal tracks; and wherein the first, second, fourth and fifth metal tracks are electrically connected to each other by vias extending between the first and second metallization levels; and wherein the third and sixth metal tracks are electrically connected to each other by a via extending between the first and second metallization levels to form a part of a detection electrical path having an input terminal and an output terminal configured to permit a measurement of a quality which is indicative of a presence of a crack in said underlying structure.

11. The integrated circuit according to claim 10, wherein the first and second metal tracks, and the fourth and fifth metal tracks, are spaced apart from each other by an interval of a first width, and wherein the width of each of the third and sixth metal tracks is less than one tenth of the first width.

12. The integrated circuit according to claim 10, further comprising a measurement circuit configured to measure a resistive value between the input terminal and the output terminal of said detection electrical path.

13. The integrated circuit according to claim 10, wherein the quality which is indicative of the presence of a crack in said underlying structure is a resistance value of the detection electrical path.

14. An integrated circuit, comprising:

at least one solder pad including, in a superposition of a plurality of metallization levels, an underlying structure comprising a network of first parallel metal tracks present in at least two metallization levels and which are arranged for reinforcing a mechanical strength of said underlying structure and for establishing an electrical connection between an upper metallization level and a lower metallization level of the underlying structure;

wherein the first parallel metal tracks of the underlying structure in one of said at least two metallization levels extend parallel to each other in a first direction;

wherein the first parallel metal tracks of the underlying structure in another of said at least two metallization levels extend parallel to each other in a second direction perpendicular to the first direction;

wherein the first parallel metal tracks of said at least two metallization levels are electrically connected by at least one via belonging to a level of vias separating said at least two metallization levels; and a detection electrical path within the underlying structure that includes, in said at least two metallization levels, second metal tracks insulated from and passing between the first parallel metal tracks, the detection electrical path having an input terminal and an output terminal configured to permit a measurement of a quality which is indicative of a presence of a crack in said underlying structure.

15. The integrated circuit according to claim 14, wherein the first parallel metal tracks are spaced apart from each other by an interval of a first width, and wherein the second metal tracks have a second width less than one tenth of the first width.

16. The integrated circuit according to claim 14, wherein the second metal tracks in one metallization level of the at least two metallization levels and the second metal tracks in another metallization level of the at least two metallization levels are electrically connected by at least one via belonging to a level of vias separating said at least two metallization levels.

17. The integrated circuit according to claim 14, wherein the detection electrical path has a shape in the form of a filling curve that passes through a number of areas in equipartition in said underlying structure, said number being greater than a floor number, and said detection electrical path having a length between the input terminal and the output terminal that is less than a ceiling value.

18. The integrated circuit according to claim 14, wherein the detection electrical path has a shape in the form of a filling curve along a sinuous course comprising branches arranged in a star about a central region.

19. The integrated circuit according to claim 14, further comprising a measurement circuit configured to measure a resistive value between the input terminal and the output terminal of said detection electrical path.

20. An integrated circuit, comprising:

at least one solder pad including, in a superposition of a plurality of metallization levels, an underlying structure comprising a network of first parallel metal tracks present in at least two metallization levels and which are arranged for reinforcing a mechanical strength of said underlying structure and for establishing an electrical connection between an upper metallization level and a lower metallization level of the underlying structure; and a detection electrical path within the underlying structure that includes, in said at least two metallization levels, second metal tracks insulated from and passing between the first parallel metal tracks, the detection electrical path having an input terminal and an output terminal configured to permit a measurement of a quality which is indicative of a presence of a crack in said underlying structure;

wherein the detection electrical path has a shape in the form of a filling curve along a sinuous course comprising branches arranged in a star about a central region.

21. The integrated circuit according to claim 20, wherein the first parallel metal tracks are spaced apart from each other by an interval of a first width, and wherein the second metal tracks have a second width less than one tenth of the first width.

22. The integrated circuit according to claim 20, wherein the first parallel metal tracks of the underlying structure in one of said at least two metallization levels extend parallel to each other in a first direction and wherein the first parallel metal tracks of the underlying structure in another of said at least two metallization levels extend parallel to each other in a second direction perpendicular to the first direction, and wherein the first parallel metal tracks of said at least two metallization levels are electrically connected by at least one via belonging to a level of vias separating said at least two metallization levels.

23. The integrated circuit according to claim 20, wherein the second metal tracks in one metallization level of the at least two metallization levels and the second metal tracks in another metallization level of the at least two metallization levels are electrically connected by at least one via belonging to a level of vias separating said at least two metallization levels.

24. The integrated circuit according to claim 20, wherein the detection electrical path has a shape in the form of a filling curve that passes through a number of areas in equipartition in said underlying structure, said number being greater than a floor number, and said detection electrical path having a length between the input terminal and the output terminal that is less than a ceiling value.

25. The integrated circuit according to claim 20, further comprising a measurement circuit configured to measure a resistive value between the input terminal and the output terminal of said detection electrical path.

\* \* \* \* \*